United States Patent [19]
Negishi

[11] Patent Number: 5,629,880
[45] Date of Patent: May 13, 1997

[54] CALIBRATION DATA TRANSMISSION APPARATUS AND METHOD FOR SEMICONDUCTOR TEST EQUIPMENT

[75] Inventor: Toshiyuki Negishi, Ohizumi-machi, Japan

[73] Assignee: Advantest Corporation, Tokyo, Japan

[21] Appl. No.: 426,857

[22] Filed: Apr. 24, 1995

[30] Foreign Application Priority Data

Apr. 22, 1994 [JP] Japan ..................... 6-107939

[51] Int. Cl.$^6$ ................................. G06F 17/00
[52] U.S. Cl. ................................. 364/579
[58] Field of Search ................... 364/579, 580, 364/551.01, 571.04, 571.07; 324/73.1, 158.1; 371/27, 20.1

[56] References Cited

U.S. PATENT DOCUMENTS

| | | | |
|---|---|---|---|
| 4,517,661 | 5/1985 | Graf et al. | 371/27 |
| 5,115,407 | 5/1992 | Bird et al. | 364/579 |
| 5,477,139 | 12/1995 | West et al. | 324/158.1 |

FOREIGN PATENT DOCUMENTS

8700267  1/1987  WIPO .................. 364/571.04

*Primary Examiner*—Ellis B. Ramirez
*Attorney, Agent, or Firm*—Knobbe, Martens, Olson & Bear, LLP

[57] ABSTRACT

A calibration data transmission apparatus and method for a semiconductor test equipment is disclosed which is capable of decreasing the capacity of a memory for storing the calibration data and also reducing the time for transmitting the calibration data. The calibration data transmission apparatus includes a pin mode data memory which stores different types of calibration mode data for each test pin, a calibration file memory which stores calibration data each of which corresponds to each test pin and the calibration mode data, and a calibration flag circuit which detects a coincidence between the calibration data to be transmitted and the previous calibration data. In another aspect, the data transmission apparatus further includes a calibration transmission sequence part which controls a sequence of transmitting the calibration data, a pin counter which is controlled by the calibration transmission sequence part to generate the address data for the calibration file memory and a par-pin control part which controls the timing of incrementing the calibration file memory based on a signal from the calibration flag circuit showing a coincidence or non-coincidence of the present calibration data and the previous calibration data.

6 Claims, 8 Drawing Sheets

AN EXAMPLE OF USER PROGRAM

TEST 1
    P1~n = normal
    ↓
    CALL CAL(file 1)
    ↓
    TEST TEST 2
    P2 = PMUXormal
    ↓
    P1, P3~n = normal
    ↓
    CALL CAL(file 2)
    ↓
    TEST

. . .

TEST m
    P2, n = PMUX
    ↓
    P1, P3~Pn−1 = normal
    ↓
    CALL CAL(file m)
    ↓
    TEST TEST m+1
    P1~n = normal
    ↓
    CALL CAL(file 1)
    ↓
    TEST

TEST m+2
    P1~n = normal
    ↓
    CALL CAL(file 1)
    ↓
    TEST

FIG. 5

ALGORITHM OF CALL CAL

FIG. 6

ALGORITHM OF TEST

FIG. 7

FIG. 9A CLK
FIG. 9B PIN COUNTER 620 INPUT
FIG. 9C PIN COUNTER 620 OUTPUT
FIG. 9D PIN DATA MEMORY 300 OUTPUT
FIG. 9E CAL FILE MEMORY 200 OUTPUT
FIG. 9F WD
FIG. 9G WE
FIG. 9H WC
FIG. 9I CAL FLAG RESET

CALIBRATION DATA TRANSMISSION APPARATUS AND METHOD FOR SEMICONDUCTOR TEST EQUIPMENT

FIELD OF THE INVENTION

The present invention relates to a transmission apparatus and method for a semiconductor test equipment which is capable of reducing a data transmission time and a memory capacity of calibration data files. The transmission of calibration data in this invention includes a data transfer from a control file to skew adjusters provided in the semiconductor test equipment.

BACKGROUND OF THE INVENTION

A semiconductor test equipment for a large scale integrated circuit includes a large number of test pins as well as test functions. Each of the test functions for each test pin is calibrated prior to a test of a device under test in order to improve a measurement accuracy such as a propagation time. In general, this calibration is executed by transmitting a calibration data file to an appropriate circuit in the test equipment.

Figure 2:
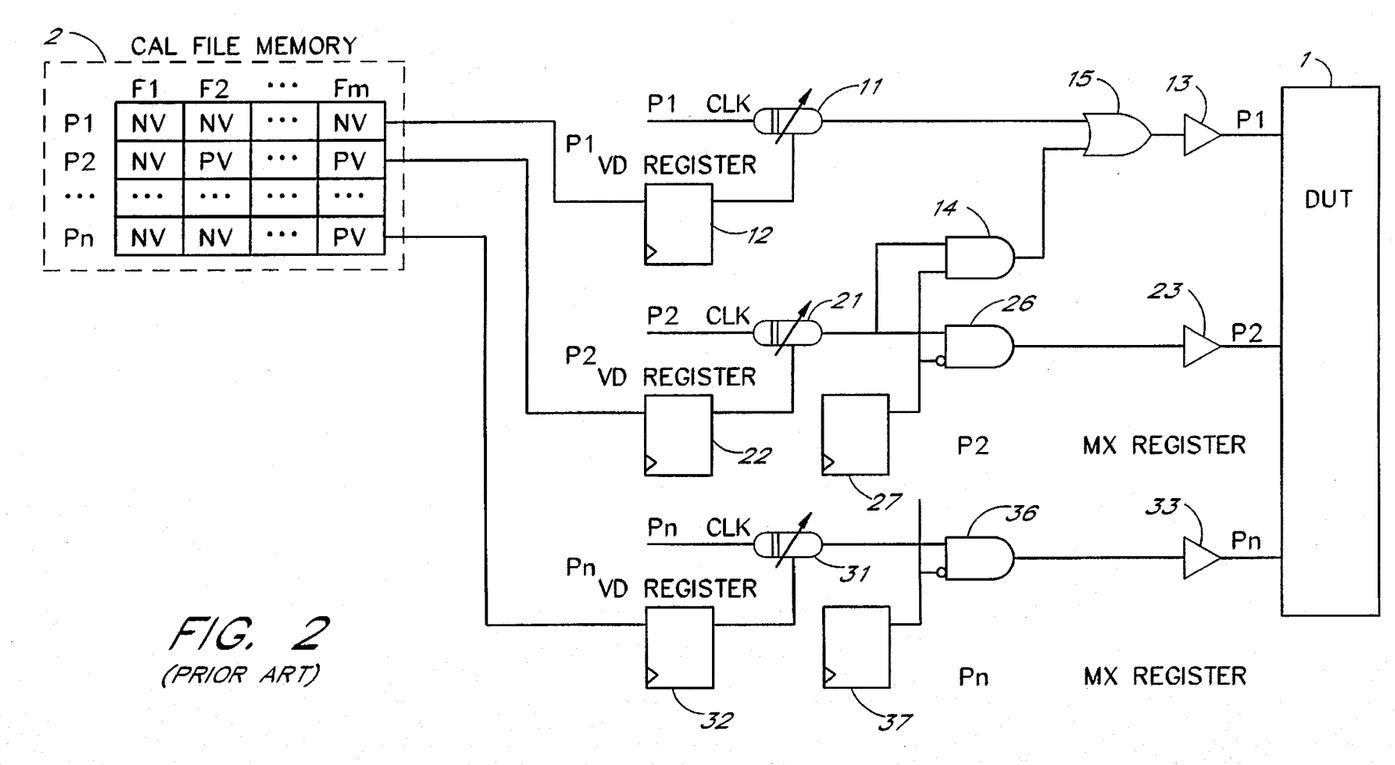
FIG. 2 shows an example of a calibration sub-system in a conventional semiconductor test equipment.

FIG. 2 shows an example of circuit structures for such a pre-test calibration in a conventional semiconductor test equipment. The semiconductor test equipment has a large number, for example 512 of drivers, exemplified by drivers 13, 23, and 33 for an IC (integrated circuit) device under test (hereinafter referred to as DUT) 1. The drivers 13, 23 ... 33 are provided in the semiconductor test equipment to accommodate the maximum possible device pin numbers included in an IC device to be tested.

The driver 13 has a variable delay circuit 11 for a skew adjustment of clock timing in a test signal to be provided to a device pin $P_1$. The value for the skew adjustment is transferred to a variable delay (VD) register 12. Similarly, for a device pin $P_2$, a variable delay circuit 21 and a VD register 22 are provided, and for a device pin $P_n$, a variable delay circuit 31 and a VD register 32 are respectively provided.

The calibration data such as the skew adjustment values for the device pins $P_1, P_2 ... P_n$ are given to the VD registers 11, 21 ... 31 from a calibration file "CAL FILE" memory 2. Thus, a skew of a test signal for each device pin is adjusted prior to the test of the DUT 1 so that, for example, the timings in the test signals for all the device pins coincide.

In general, a modern semiconductor test equipment has so called a pin multiple function to achieve a high-speed test signal generation and a complex driver waveform. Multiplex registers 27 ... 37 shown in FIG. 2 are provided for channels corresponding to the even number of device pins to perform the pin multiple function. When a pin multiplex mode is set in the device pin $P_2$, a gate 26 inhibits a $P_2CLK$ signal, and as a result the output of driver 23 is inhibited. The $P_2CLK$ signal passes through a gate 14 and is combined with a $P_1CLK$ signal in an OR gate 15. Therefore, the $P_1CLK$ and $P_2CLK$ signals are output through the driver 13 to be supplied to the device pin $P_1$ of the DUT 1.

That is, by the operation of the OR gate 15, a clock signal of an even number pin and a clock signal of an odd number pin are multiplexed to form a combined signal which is output to the odd number pin. This produces a test signal which is two times faster than a clock signal in each channel of circuit corresponding to one device pin. In the example of FIG. 2, the only circuit channels corresponding to the even number device pins have multiplex registers 27 and 37 for the pin multiplex mode.

As noted above, the calibration data in the CAL FILE memory 2 is transmitted to the VD register 12, 22, and 32. The calibration data for the skew adjustment in the normal mode would be different from that of the pin multiplex mode, even for the same device pin, because of differences in signal propagation times since signal transmission paths are different between the two modes. Therefore, the CAL FILE memory 2 stores different calibration data, normal mode data (NV) and pin multiplex mode data (PV) for each device pin as shown in FIG. 2. Since the number of device pins is large, 512 for example, and the different calibration data are required for the normal mode and the multiplex mode, the capacity of the calibration file memory 2 to store the calibration data for all of the device pins becomes very large.

In addition, since many combinations between the device pins are required, the CAL FILE memory 2 needs a large number of data files F1, F2 ... Fm. Therefore, the CAL FILE memory 2 needs the memory capacity of n×m×x (bits) where a word length of the calibration data is x bits, a total number of device pins is n and the number of possible combination of device pins is m.

Figure 5:
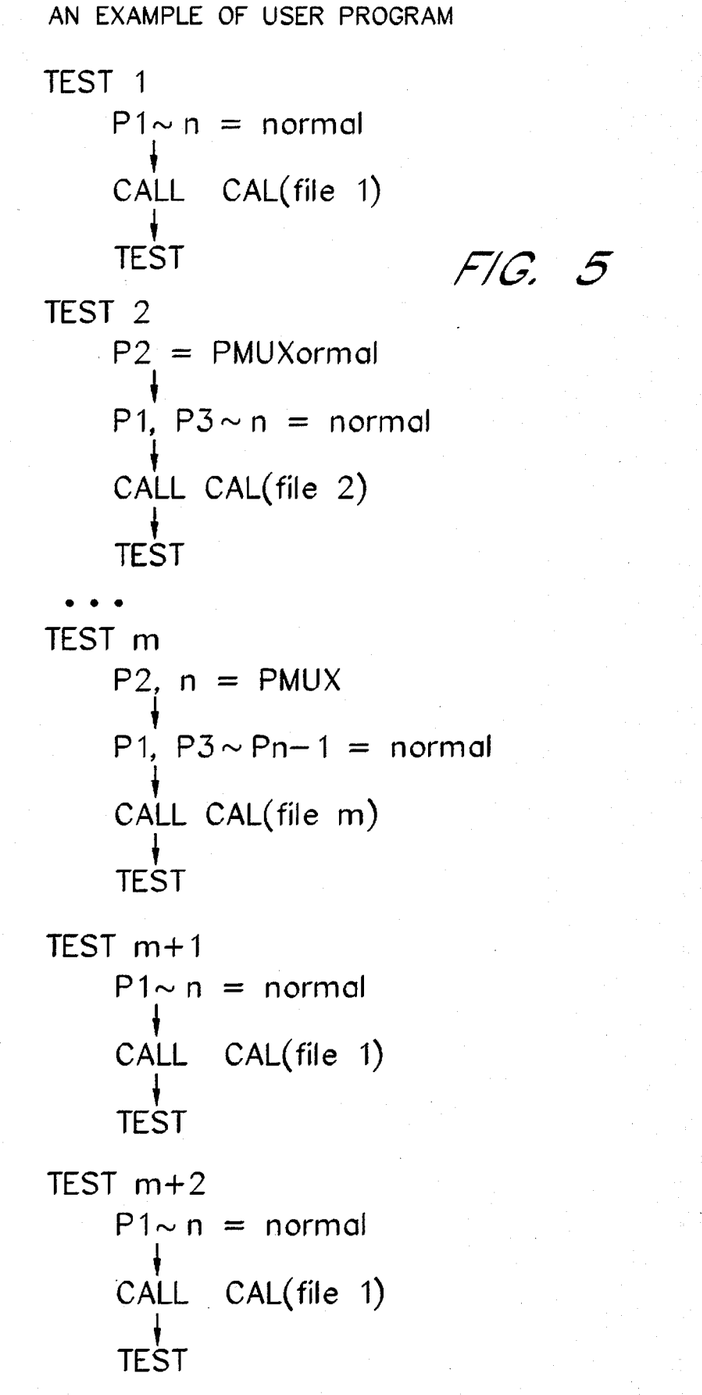
FIG. 5 is an example of user program in the conventional test equipment.

The calibration data for the CAL FILE memory 2 is created as explained in FIG. 5 which shows an example of user programming in the conventional semiconductor test equipment of FIG. 2.

In the user program of FIG. 2, first, all the device pins $P_1-P_n$ for a first test "TEST 1" are set to the normal mode. A calibration data file "file 1" is created under this condition for all the device pins $P_1-P_n$. That is, a calibration operation for each device pin is executed in this step for forming the calibration data file. When the calibration operation is completed, the data file for all the pin data is created.

Next, in a second test "TEST 2", the device pin $P_2$ is set in the multiple pin mode and other device pins are set in the normal mode. In this situation, because the conditions of signal propagation routes to the corresponding device pins are different from that in the TEST 1, a separate calibration data file is needed. Therefore, a calibration data file "file 2" is created in this step.

Next, the device pin $P_2$ and the device pin $P_n$ in the "TEST m" are set in the multiple pin mode, and other device pins are set in the normal mode. In this situation, the condition of the signal propagation paths are different from that in the TEST 1 and TEST 2. Therefore, another calibration data file "file m" is created in this step. In the conventional semiconductor test equipment, the number m of files in the calibration file memory 2 will increase with the increase in the number of tests.

Next, for a test "TEST (m+1)", all of the device pins $P_1-P_n$ are set in the normal mode. The condition of the signal propagation for this setting is the same as in the TEST 1. Therefore, the calibration will not be executed in this step and the content of the "file 1" is transmitted to each of the VD registers 12, 22 ... 32. That is, only a transmission of the calibration data is executed here.

Next, for a test "TEST (m+2)", all the device pins $P_1-P_n$ are once again set in the normal mode. In this situation, the conditions of signal propagation paths to the corresponding device pins are the same as that in the "TEST 1" or the "TEST (m+1)", the calibration data of which are already transmitted to the VD registers 12, 22 ... 32. Thus, theoretically, in this step, it is not necessary to newly create a description of calibration instruction by the user program.

However, since the user program is provided in this manner, the file transmitting operation is unconditionally executed, which lowers a test throughput. This is a result caused by opening a CALL CAL (call calibration) sentence to the user.

Figure 6:
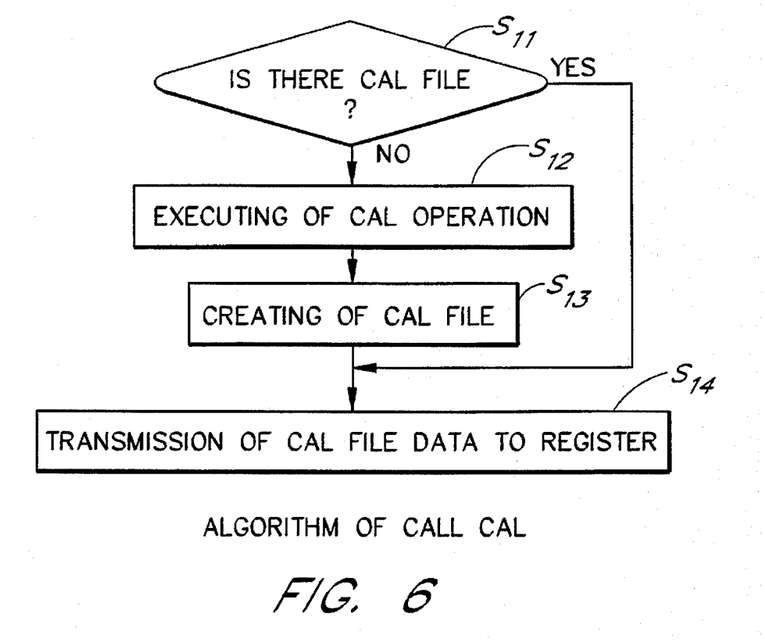
FIG. 6 is a flow chart showing an example of algorithm in the conventional CALL CAL sentence.

FIG. 6 shows an algorithm of a conventional CALL CAL sentence. At a step S11, it is determined whether there exists a CAL FILE of the same name. If the same CAL FILE (calibration file) exists, the algorithm moves to a step S14 wherein the calibration file data is transmitted to the VD registers.

If the CAL FILE of the same name does not exist, a CAL operation is executed in a step S12 so that a CAL FILE is created in a step S13. In general, the execution time of the CAL operation requires a significant length of time compared with the transmission time of the CAL FILE.

After transmitting the CALFILE value created like this manner, the operation based on TEST sentences is proceeded. Thus, in the conventional test equipment described above, there is a problem in that the data file memory for the calibration data requires a large capacity. Another problem in the conventional test equipment is that a significantly long time is required to create the calibration data and to transmit such data.

BACKGROUND OF THE INVENTION

Therefore, it is an object of the present invention is to provide a solution of the above-mentioned problems in the conventional technology for a timing calibration in a semiconductor test equipment.

It is a major object of the invention is to provide a transmission apparatus and method for calibration data of a semiconductor test equipment.

A particular object of the invention is to reduce the size of calibration data files when the calibration data is transmitted to askew adjusters or other circuit components in the semiconductor test equipment.

It is a further object of the present invention to reduce a transmission time of the calibration data from the calibration data files to the corresponding channels of circuits in the test equipment.

In one aspect of the present invention, the transmitting apparatus has a PIN DATA memory which stores the calibration mode data for each test pin, a CAL FILE memory which reads the calibration data stored beforehand according to the output of the PIN DATA memory 300, and a CAL FLAG circuit which detects a coincidence between the calibration data to be transmitted for the next test and the previous calibration data which has been transmitted.

The above-mentioned CAL FLAG circuit has an exclusive OR gate which compares the calibration mode data which is transmitted by a tester controller and the output data of the PIN DATA memory. The CAL FLAG circuit also has a flip-flop which stores the comparison result of the output of the exclusive OR gate and an OR gate which is connected to the output of the flip-flop and to the output of the exclusive OR gate 403.

In another aspect of the present invention additionally includes a CAL transmission sequence part which controls a sequence of transmitting the calibration data to the test pins and a PIN counter which is controlled by the CAL transmission sequence part to generate the address data for the CAL FILE memory. In the further aspect of the present invention includes a par-pin control part which controls the timing of incrementing the CAL FILE memory based on a signal from the CAL FLAG circuit showing a coincidence or non-coincidence of the calibration data to be transmitted and the preceding calibration data which has already been transmitted for the previous test.

According to the present invention, the capacity of the CAL FILE memory to store the calibration data can be substantially reduced. Furthermore, when the calibration data is transmitted to circuit elements corresponding to the test pin, such as skew adjusters installed in the semiconductor test equipment, the transmission time for the calibration data and the amount of the calibration data to be transmitted are significantly reduced.

BRIEF DESCRIPTION OF THE INVENTION

DETAILED DESCRIPTION OF THE INVENTION

Figure 1:
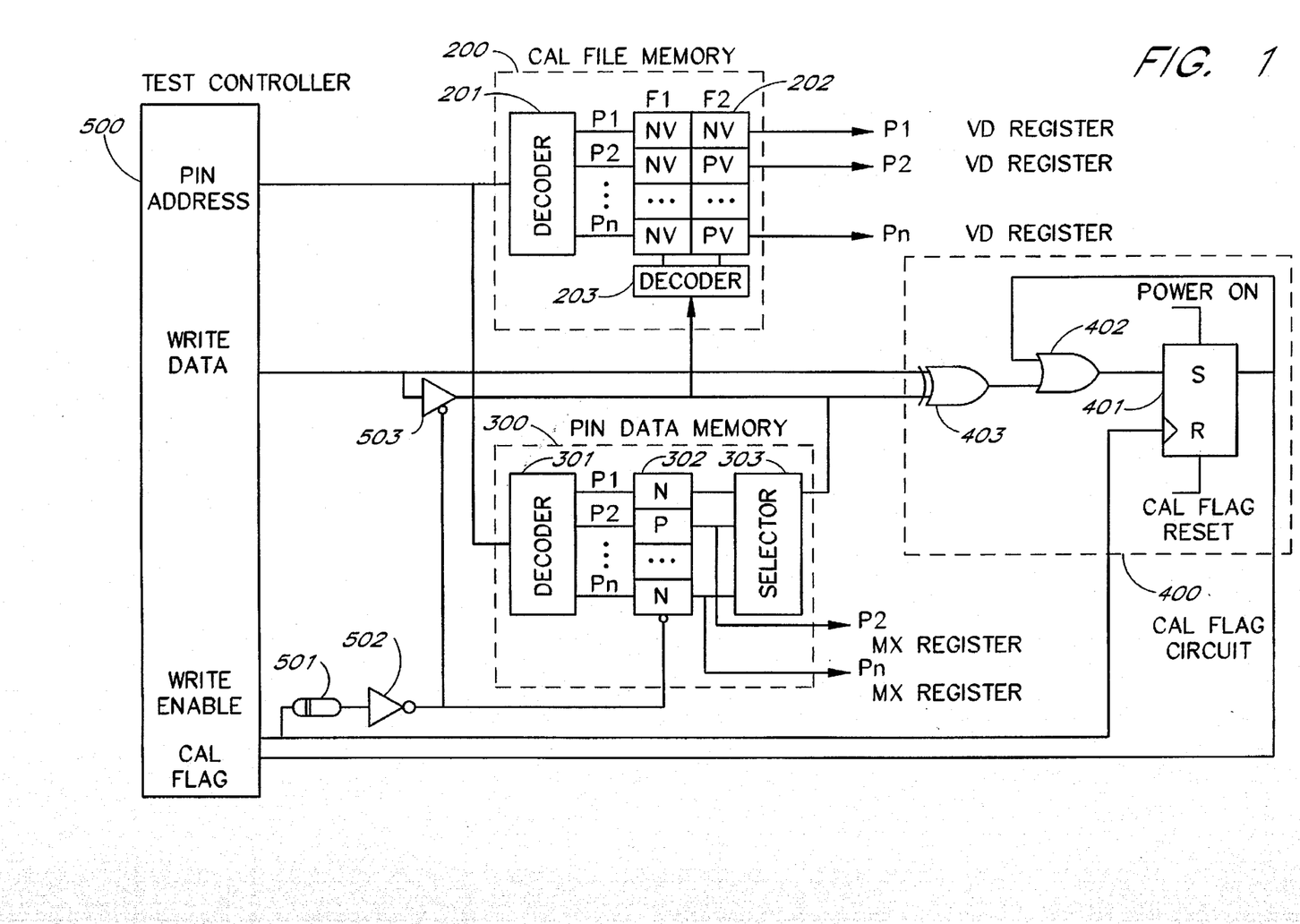
FIG. 1 is a block diagram which shows a first embodiment of the present invention.

An example of the first embodiment of the calibration data transmission apparatus according to the present invention is explained with reference to the drawings. FIG. 1 shows a block diagram of the first embodiment of the present invention. A semiconductor test equipment of the present invention has CAL FILE (calibration file) memory 200 which stores the calibration data as shown in FIG. 1.

Moreover, the calibration data transmission apparatus has a PIN DATA memory 300 which stores pin mode data. The pin mode data in the PIN DATA memory 300 represents either a normal mode or a multiplex mode for each device pin (test pin). The data transmission apparatus further includes a CAL FLAG (calibration flag) circuit 400 which detects a coincidence between preceding calibration data which has been already transmitted and calibration data to be transmitted and a tester controller 500 which controls an overall test procedure and pre-test procedure of the semiconductor test equipment.

The CAL FILE memory 200 has a file 202 and decoders 201 and 203. The file 202 is divided into a file F1 and a file F2. The file F1 stores the calibration data which represents that all the test (device) pins are in the normal mode while the file F2 stores the calibration data which represents that all the test (device) pins are in the pin multiplex mode. The decoder 201 is to switch the calibration data in the file 202 corresponding to the device pins $P_1$–$P_n$, i.e., for determining the pin address. The decoder 203 is to determine the file address, i.e., either one of the files F1 or F2. Each output of the file 202 corresponding to the test pins $P_1$–$P_n$ is connected to the corresponding VD (variable delay) registers 12, 22 . . . 32. The capacity of the CAL FILE memory 200 is n×2×x (bits) where each calibration data (PV, NV in FIG. 1) is formed of x bits.

The PIN DATA memory 300 has a file 302, a decoder 301 and a selector 303. The file 302 stores the pin mode data which represents whether the normal mode or the multiplex mode is designated for each of the device pins $P_1$–$P_n$. Each pin mode data is constructed by one bit; therefore, the capacity of the PIN DATA memory 300 is n bits. The decoder 301 is provided to switch the pin mode data in the file 302 corresponding to the device pins $P_1$–$P_n$. The selector 303 is provided to input or output the pin mode data with respect to the file 302. The selector 303 supplies the pin mode data to the CAL FLAG circuit 400. The pin mode data for the even number device pins are directly provided to the multiplex registers 27 . . . 37 (FIG. 1).

The CAL FLAG circuit 400 has a flip-flop 401, an exclusive OR circuit 403 and an OR gate 402. Each of the device pins is set either the normal mode or the pin multiplex mode. The pin mode data for the present test is given to an input terminal of the exclusive OR circuit 403 by the tester controller 500 as write data. The pin mode data is written in the file 302 when a write enable signal from the controller 500 is provided to the selector 303 through a delay element 501 and gates 502 and 503. Moreover, the pin mode data of the preceding test is given from the PIN DATA memory 300 to the other input terminal of the exclusive OR circuit 403. When both input data coincide, the exclusive OR circuit 403 outputs a low level signal, while both input data do not coincide, the exclusive OR circuit 403 outputs a high level signal.

The high or low level signal from the exclusive OR circuit 403 is provided to a data terminal of the flip-flop 401 through the OR gate 402. The high or low level signal is stored in the flip-flop 401 when a write enable signal from the tester controller 500 is given to a trigger terminal of the flip-flop 401. The output of the flip-flop 401 is connected to the other terminal of OR gate 402. Therefore, once the flip-flop 401 is set to the high level, the high level is maintained until the flip-flop 401 receives a CAL FLAG reset signal.

In this arrangement of the CAL FLAG circuit 400, it is possible to detect whether the calibration data for all of the device pins coincide one another or the calibration data in any one of the device pins do not coincide with the other calibration data. In the case where there is the non-coincidence, the CAL FLAG circuit 400 generates a CAL FLAG signal which is given to the tester controller 500. When the semiconductor test equipment is activated, i.e., the power supply of the test equipment is turned on, the flip-flop 401 is set by a power on signal to indicate that the calibration data does not exist.

In this configuration of the present invention, the memory capacity required for all of the calibration data is n×(2x+1) bits, which can provide all of the possible combination of the calibration data. Therefore, the memory capacity of the calibration data file 202 can be greatly reduced. Moreover, even if the number of TEST increases, it is not necessary to increase the capacity of the calibration data file 202.

In the foregoing explanation, only two kinds of calibration data files F1 and F2 are used in the CAL FILE memory 200; however, if the kind pin mode increases, the calibration data files can be increased accordingly.

Figure 7:
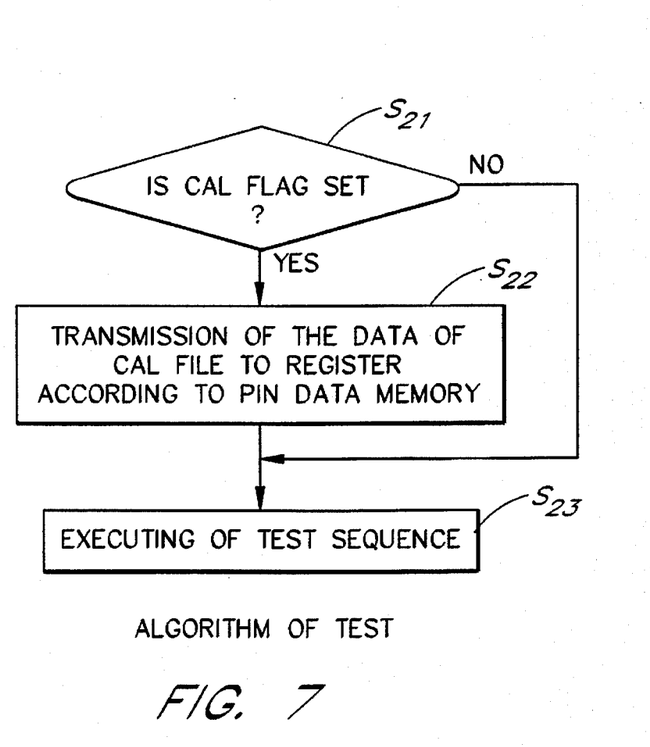
FIG. 7 is a flow chart showing an example which shows an algorithm of the TEST sentence of the present invention.

FIG. 7 shows an algorithm of the TEST sentence of the present invention. In this algorithm, the CALL CAL sentence of the present invention is not open to the user; therefore, the user cannot use the CALL CAL sentence. Namely, the transmission of the calibration data to the variable delay registers is automatically executed by a process determined by the tester controller.

In a step S21, the tester controller checks whether the CAL FLAG is set as shown in FIG. 7. If the CAL FLAG is set, the calibration data in the CAL FILE memory 200 is transferred and set to the each of the VD (variable delay) registers based on either of the normal mode or the multiplex mode indicated in the PIN DATA memory 300 at a step S22. If the CAL FLAG is not set in the step S21, or the calibration data is transmitted in the step S22, the test controller judged that the calibration data in the CAL FILE memory 200 has already transmitted, and immediately proceeds to the TEST sequence.

Moreover, the calibration data in the files F1 and F2 for the normal mode in all the device pins and the pin multiplex mode in all the device pins are obtained in executing the calibration by the semiconductor test equipment beforehand and is set to the CAL FILE memory 200. This data in the CAL FILE memory does not depend on the content of each test, therefore, used commonly in the different test. For instance, the calibration data which can be determined through a calibration operation performed by a manufacturer before the shipment of the semiconductor test equipment.

As has been in the foregoing, the user need not describe the CALL CAL sentence when creating the user program because transmission of the calibration data to delay each circuit is automatically executed. Therefore, a program creation becomes easy and an efficiency caused by a double transmission of the same calibration data is reduced. Moreover, the calibration is not executed during the test of the device, therefore, the time required to transmit the calibration data can be greatly reduced.

In the foregoing example, the same calibration data is not repeatedly transmitted to reduce the transmission time. If the calibration data differs from one another, the calibration data for all of the device pins are transmitted separately. However, even in such a situation, the calibration data can be rewritten only for a device pin which needs the renewed calibration data which is different from the preceding data. This is accomplished by the structure as described below.

Figure 4:
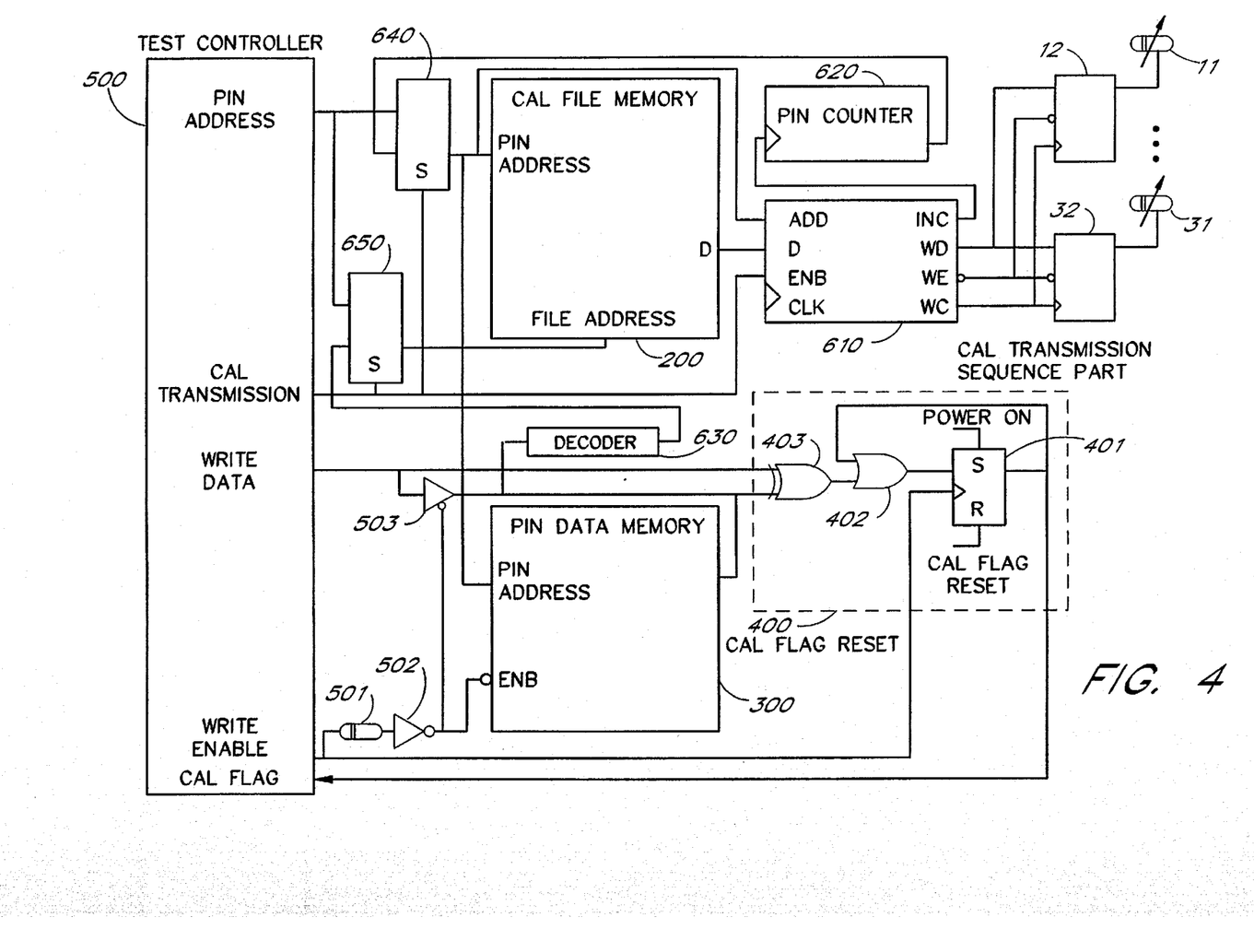
FIG. 4 is a block diagram which shows an example of a calibration data transmission apparatus incorporating the first embodiment of the present invention.

FIG. 4 is an example of structure developed from the embodiment of FIG. 1. In FIG. 4, the calibration data transmission apparatus additionally includes a CAL transmission sequence part 610, a PIN counter 620, a decoder 630 and selectors 640 and 650. The transmission sequence part 610 operates to transmit the output of the CAL FILE memory 200 to each VD register. A CAL transmission signal is given to the CAL transmission sequence part 610 by the tester controller 500, as shown in FIG. 4.

The CAL transmission signal is also provided to the selectors 640 and 650 so as to change the pin address and the file address of the CAL FILE memory 200. Namely, the pin address is determined by an output of the PIN counter 620 and the file address is determined by an output of the decoder 630. When the tester controller 500 sets an arbitrary pin address, the calibration data at that time is output from the CAL FILE memory 200. The CAL transmission sequence part 610 gives write data (WD), a write enable (WE) signal, and a write command (WC) signal to each of the VD registers 12, 22 . . . 32 corresponding to the device pins under consideration.

After that, The CAL transmission sequence part 610 provides an address increment signal to the PIN counter 620. The PIN counter 620 increments by one and outputs the next test pin address. The pin address is provided to the CAL FILE memory 200 through the selector 640 to determine the calibration data for the next pin address. The CAL data transmission operation of above-mentioned calibration data is repeated, for example, from the first pin address to the last pin address one by one.

FIG. 8 shows a timing chart of the CAL data transmission operation in the configuration of FIG. 4. The CAL transmission sequence part 610 provides the address increment signal (FIG. 8B) in synchronism with the clock signal (FIG. 8A) to the PIN counter 620. The PIN counter 620 generates the pin address signals CH1–CH3 (FIG. 8C) to set the pin address in the CAL FILE memory 200. An output the PIN DATA memory 300 (FIG. 8D) determines the file address of the CAL FILE memory 200 to select the pin mode, i.e., the normal mode or the multiplex mode.

Figure 8A:
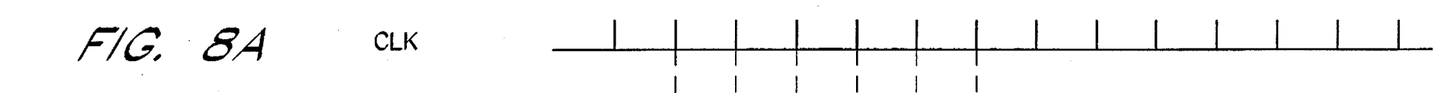
FIG. 8 is a timing chart showing an operation of the calibration data transmission.
Figure 8B:
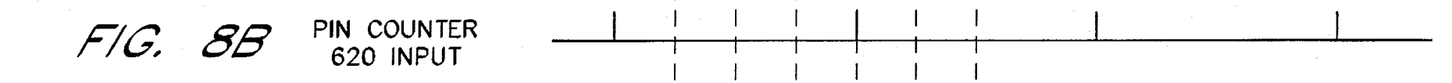
Figure 8C:
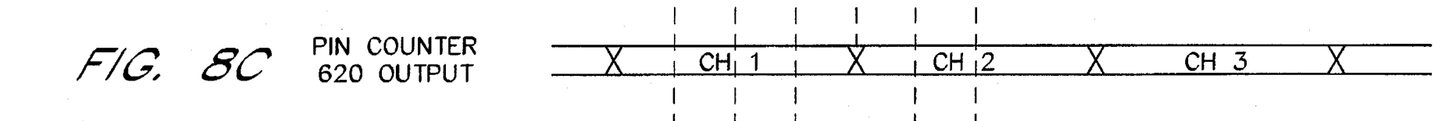
Figure 8D:
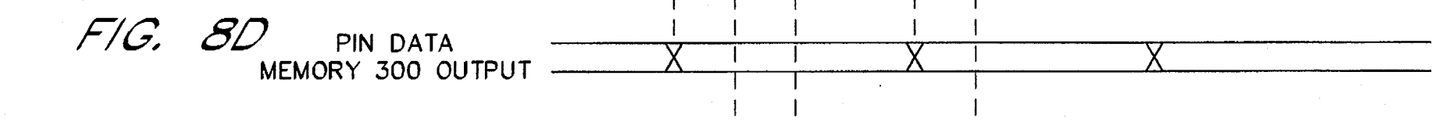
Figure 8E:
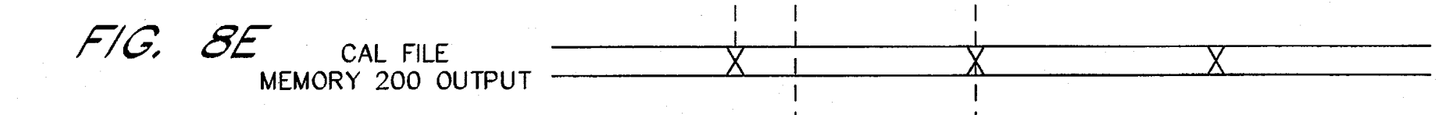
Figure 8F:
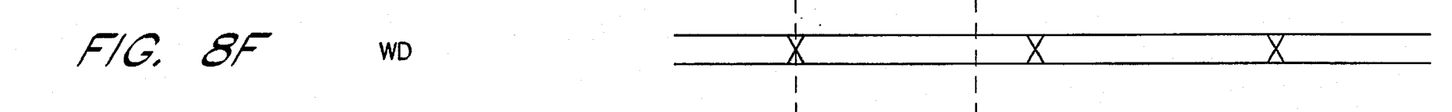
Figure 8G:
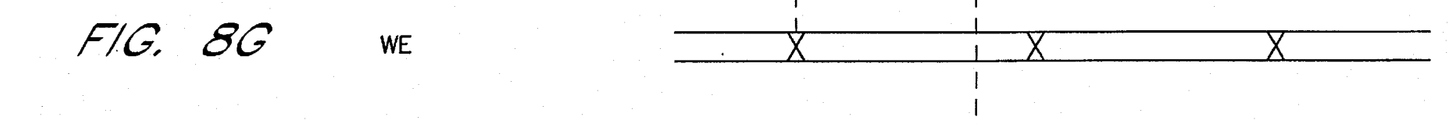
Figure 8H:
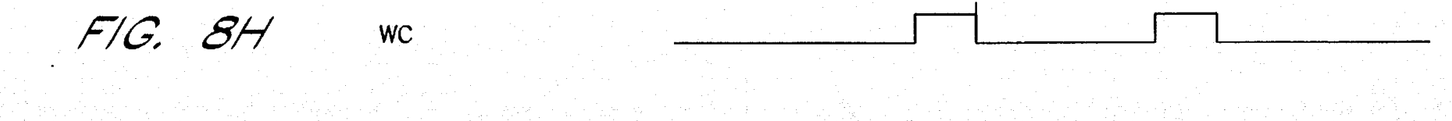

Therefore, the calibration data is transferred to the CAL transmission sequence part 610 in the next clock timing as shown in FIG. 8E. The calibration data is supplied as write data WD (FIG. 8F) to the VD registers 12, 22 ... 32 in the next clock timing. The write enable (WE) signal is also transferred to the VD registers in the same timing with the write data as shown in FIG. 8G to define the VD register corresponding to the device pin designated by the pin address. By the write command (WC) signal (FIG. 8H), the calibration data is stored in the VD register. In the next clock timing, the PIN counter 620 increment by one to designates the next pin address. Thus, in this example, the transmission time of the calibration data for one device pin requires four clock cycles.

Figure 3:
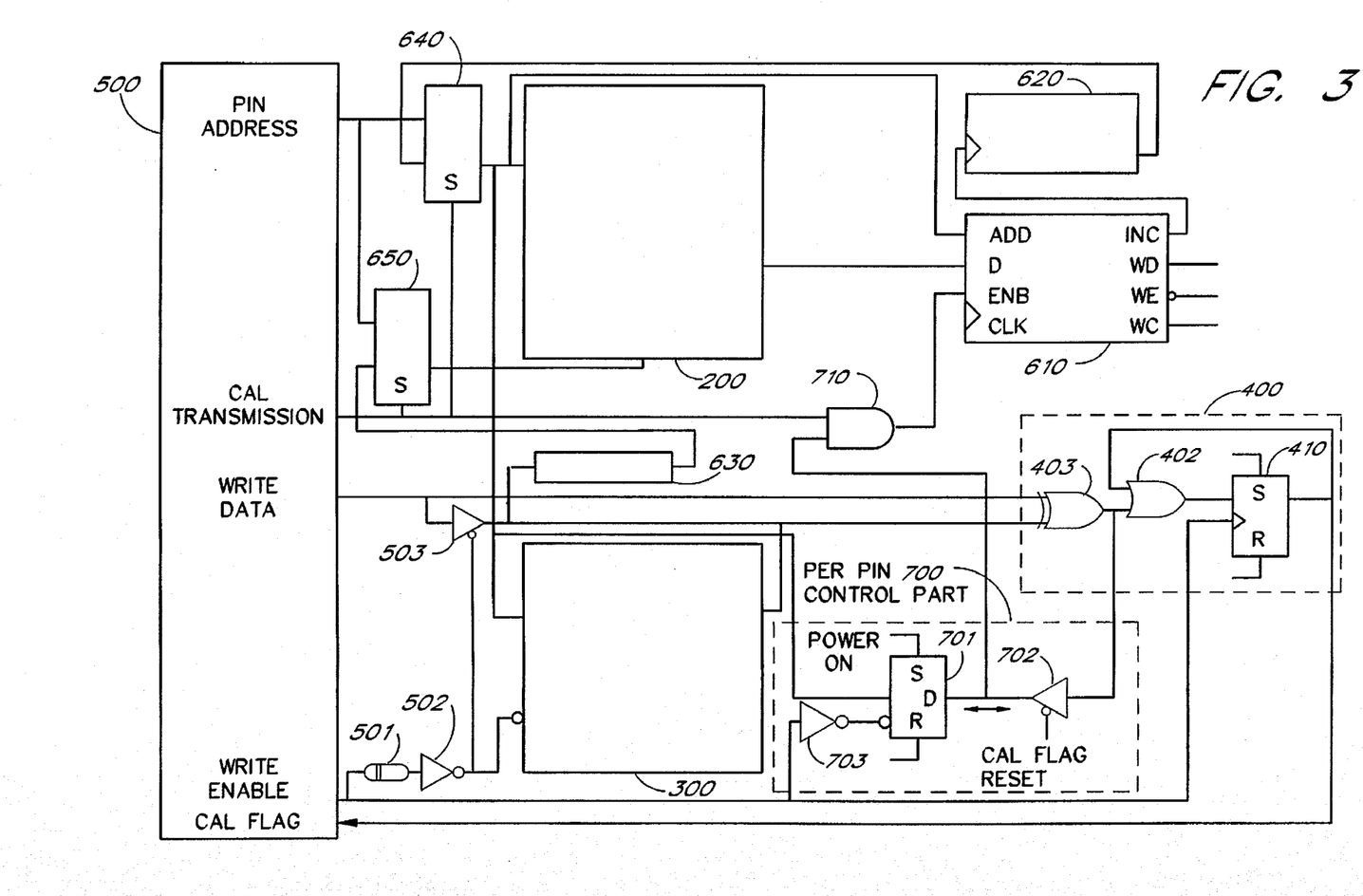
FIG. 3 shows a second embodiment of the present invention which is a calibration data transmission apparatus having a par-pin control part.

An example of the second embodiment of the present invention is explained with reference to FIGS. 3 and 9. In the arrangement of FIG. 3, the calibration data transmission apparatus includes a per-pin control part 700 in addition to the arrangement of FIG. 4. The per-pin control part 700 is provided to control the write timing of the calibration data in the VD registers. An output of the per-pin control part 700 is provided to the CAL transmission sequence part 600 through an AND gate 710. The per-pin control part 700 is formed of a memory 701 such as a flip-flop and gates 702 and 703.

In operation, first, a calibration data which is the write data is written for an arbitrary test pin address by the tester controller 500. In that case, the exclusive OR gate 403 in the CAL FLAG circuit 400 outputs a signal showing a coincidence or a non-coincidence between the calibration data to be transmitted and the previous calibration data which has been already transmitted. The non-coincidence signal is given to the data terminal of the memory 701 through gate 702 and it is written therein by a write enable signal.

Next, after the state of the write enable ends, the output signal of the memory 701 is given to an input terminal of the AND gate 710. The other input terminal of the AND gate 710 is provided with a CAL transmission signal by the tester controller 500. The output of the AND gate 710 is connected to the enable (ENB) terminal of the CAL transmission sequence part 610.

For transmitting the calibration data transmitted to the VD registers, the CAL transmission signal is generated by the tester controller 500. When the signal from the CAL FLAG circuit 400 for the each test shows the non-coincidence condition, i.e., the signal is in the low level, the CAL transmission signal is inhibited by the AND gate 710. Therefore, the transmission of the calibration signal to the VD register is also inhibited.

FIG. 9 shows the timing chart of the calibration data transmission apparatus with the per-pin control part of the present invention. For example, if the calibration data to be transmitted differs from the preceding calibration data for the CH1 (channel 1) which corresponds to the device pin $P_1$, then it is necessary to send the calibration data to the VD register 12. In this situation, the transmission time needs four clock cycles as shown in FIGS. 9G and 9H.

Figure 9A:
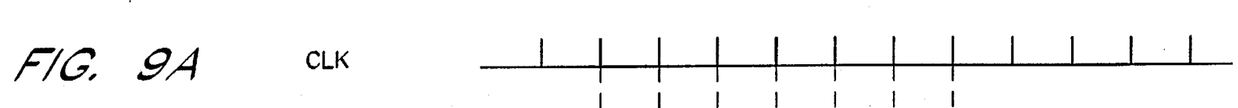
FIG. 9 is a timing chart showing an example of operation wherein the calibration data transmission apparatus has the par-pin control part in accordance with the present invention.
Figure 9B:
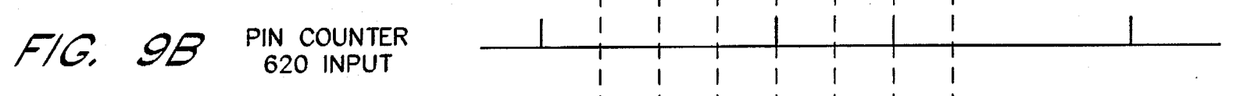
Figure 9C:
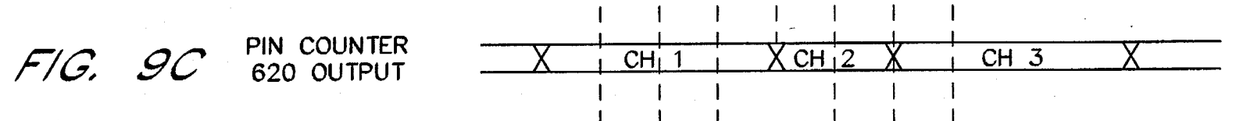
Figure 9D:
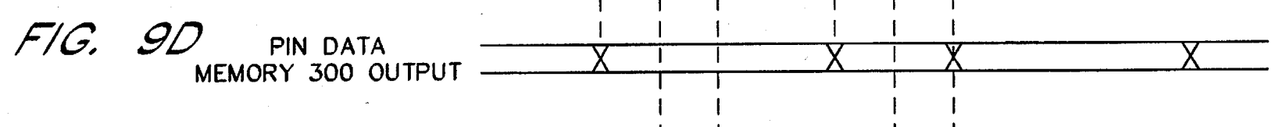
Figure 9E:
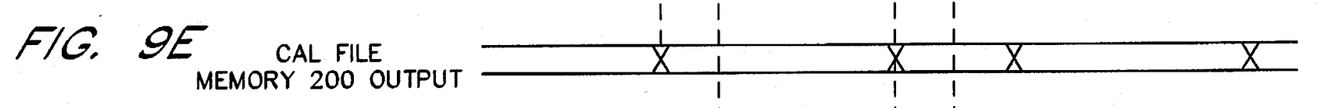
Figures 9F, 9G:
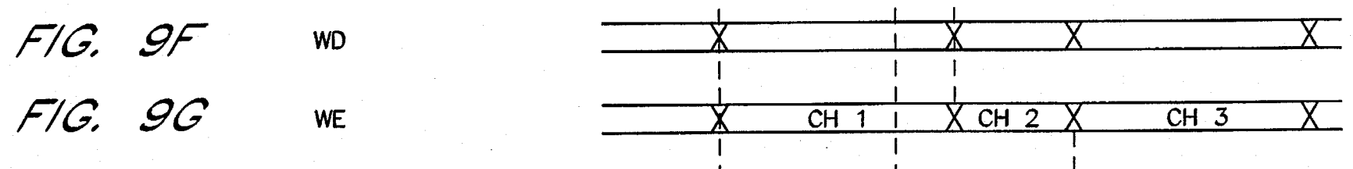
Figure 9H:
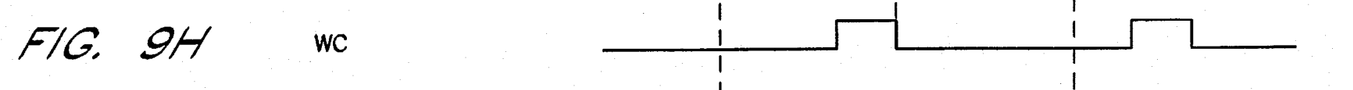
Figure 9I:
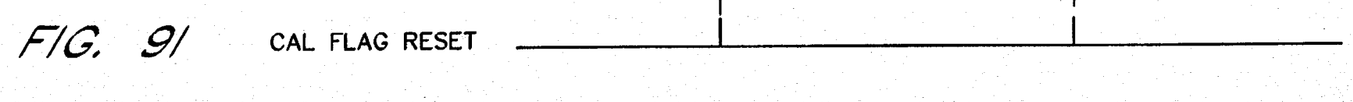

For the CH2 (channel 2), if the calibration data for the next test is the same as that of the preceding calibration data, the CAL FLAG signal received by the per-pin control part 700 is low. In this case, the CAL transmission signal is inhibited at the AND gate 710, and the output of the write command (WC) from the CAL transmission sequence part 610 is inhibited as shown in FIG. 9H. Thus, the transmission of the calibration data for the CH2 is not performed for the VD register 22 so that the VD register 22 maintains the previous calibration data. The INC (increment) signal is generated by the CAL transmission sequence part 610 to shift the operation to the CH3 (channel 3) which is the following test pin address. Therefore, the transmission time for the channel 2 is reduced to two cycles rather than the four cycles in the example of FIG. 4.

Thus, in the second embodiment of the present invention, it is possible to decrease the transmission time of the calibration data from four clock cycles to two clock cycles according to the output of the per pin control part 700. Especially, when the number of the test pins which needs to update the calibration data is small, the transmission time of the calibration data of all the test pins is reduced to almost a half of the first embodiment. Therefore, the transmission time of the calibration data can be greatly reduced.

In the foregoing description regarding the transmission of the calibration, the present invention is introduced in an application of transmitting the calibration data to the skew adjuster driver 13, 23 ... 33. However, it is also possible to apply the apparatus and method of the present invention to other circuit elements such as comparators which compare the output of the DUT 1 with expected data derived from the semiconductor test equipment.

The present invention described above has following effects: The capacity of the memory to store the calibration data can be substantially reduced. When the calibration data is transmitted to the skew adjusters installed in the semiconductor test equipment, the transmission time of the calibration data and the amount of the calibration data to be transmitted are significantly reduced.

What is claimed is:

1. A data transmission apparatus which transmits calibration data for each test pin of a semiconductor test equipment comprising:

a pin mode data memory (300) which stores different types of calibration mode data for each test pin;

a calibration file memory (200) which stores calibration data each of which corresponds to said each test pin and said calibration mode data, said calibration file memory being accessed by a pin address from a test controller to define the calibration data for a specific test pin and a file address from said pin mode data memory to define said calibration mode data for said specified test pin; and a calibration flag circuit (400) which detects a coincidence between said calibration data to be transmitted and the previous calibration data.

2. A data transmission apparatus as defined in claim 1, wherein; said calibration flag circuit (400) which transmits the calibration data of the semiconductor test equipment comprising:

an exclusive OR gate (403) which compares an output data of the said DATA memory (300) and a calibration mode data is transmitted from tester controller (500);

a flip flop (401) which stores a comparison result of the exclusive OR gate (403); and OR gate (402) which is supplied an output of the said flip flop (401) to an input terminal and an output of the said exclusive OR gate (403).

3. A data transmission apparatus as defined in claim 1, further includes a per-pin control part (700) which detects a coincidence for each test pin of the calibration data to be transmitted and a transmitted preceding calibration data.

4. A transmission apparatus as defined in claim 3, further includes:

a calibration transmission sequence part (610) which controls a sequence of transmitting the calibration data to said test pins; and a PIN counter which is controlled by the CAL transmission sequence part to generate the address data for said calibration file memory (200).

5. A data transmission method of the calibration data for each test pin of a semiconductor test equipment comprising the following step of:

storing the calibration data to the CAL FILE memory (200), sending the calibration mode for the each test pin to the PIN DATA memory (300), recognizing a CAL FLAG of an output of the CAL FLAG circuit (400) which detects a coincidence of the calibration data to be transmitted and transmitted preceding calibration data, and transmitting the calibration data only when the CAL FLAG showed a non-coincidence.

6. A data transmission method of the calibration data for each test pin of a semiconductor test equipment comprising the following step of:

storing the calibration data to the CAL FILE memory (200), sending the calibration mode for the each test pin to the PIN DATA memory (300), storing the coincidence or not coincidence of the calibration data to be transmitted and transmitted preceding calibration data to a per pin control part, and transmitting the calibration data only when the per pin control part (700) shows a non-coincidence.

* * * * *